US008222806B2

(12) United States Patent
Jou et al.

(10) Patent No.: US 8,222,806 B2
(45) Date of Patent: Jul. 17, 2012

(54) ORGANIC LIGHT-EMITTING DIODE DEVICE AND MANUFACTURING METHOD THEREOF

(75) Inventors: Jwo-Huei Jou, Hsin-Chu (TW); Ming-Hsuan Wu, Hsin-Chu (TW)

(73) Assignee: National Tsing Hua University, Hsinchu (TW)

(*) Notice: Subject to any disclaimer, the term of this patent is extended or adjusted under 35 U.S.C. 154(b) by 438 days.

(21) Appl. No.: 12/462,728

(22) Filed: Aug. 7, 2009

(65) Prior Publication Data

US 2010/0102712 A1    Apr. 29, 2010

(30) Foreign Application Priority Data

Oct. 28, 2008  (TW) ................. 97141347 A (51) Int. Cl.
  *H01L 51/50* (2006.01)
(52) U.S. Cl. ........... 313/504; 313/506; 313/512; 445/25
(58) Field of Classification Search .......... 313/504–512; 445/25; 428/690
  See application file for complete search history.

(56) References Cited

U.S. PATENT DOCUMENTS

| 4,356,429 | A | 10/1982 | Tang |
| 4,720,432 | A | 1/1988 | VanSlyke et al. |
| 6,661,029 | B1 | 12/2003 | Duggal |
| 6,800,999 | B1* | 10/2004 | Duggal et al. ............. 315/169.1 |
| 6,847,162 | B2 | 1/2005 | Duggal et al. |
| 7,772,757 | B2* | 8/2010 | Kane et al. .................... 313/498 |
| 2007/0048545 | A1* | 3/2007 | Hatwar et al. ................. 428/690 |
| 2007/0116983 | A1* | 5/2007 | Kanno et al. .................. 428/690 |
| 2008/0284318 | A1* | 11/2008 | Deaton et al. ................. 313/504 |

OTHER PUBLICATIONS

Tang, et al., Electroluminescence of doped organic thin films, Journal of Appl. Phys., vol. 65, Issue 9, pp. 3610, 1989, Abstract.
Lee, et al., Stable styrylamine-doped blue organic electro . . . , Journal of Appl. Phys., vol. 85, Issue 15, p. 3301, 2004, Abstract.
Jou, et al., Efficient, color-stable fluorescent white organic light-emitting . . . , Journal of Appl. Phys., vol. 88, Issue 19, 2006, Abstract.

* cited by examiner

*Primary Examiner* — Nimeshkumar Patel
*Assistant Examiner* — Mary Ellen Bowman
(74) *Attorney, Agent, or Firm* — Hudak, Shunk & Farine Co. LPA (57) ABSTRACT

An organic light-emitting diode (OLED) device and a manufacturing method thereof are provided. The OLED device comprises more than one light emitting layer. The emissive zone is capable to emit red or long wavelength visible light near the cathode, and emit blue or short wavelength visible light near the anode. The device emits visible light with a lower color temperature at low voltages, and emits visible light with a higher color temperature at higher voltages. By adjusting the input voltage, the device is capable to emit white light or other color lights with desired color temperature.

34 Claims, 13 Drawing Sheets

| |
|---|
| Second conductive layer |
| Electron injection layer |
| Second electron transporting and hole blocking layer |
| Third light emitting layer |
| First electron transporting and hole blocking layer |
| Second light emitting layer |
| First light emitting layer |
| Hole transporting layer |
| First conductive layer |
| Substrate |

1010 — Second conductive layer
109 — Electron injection layer
108 — Second electron transporting and hole blocking layer
107 — Third light emitting layer
106 — First electron transporting and hole blocking layer
105 — Second light emitting layer
104 — First light emitting layer
103 — Hole transporting layer
102 — First conductive layer
101 — Substrate

ORGANIC LIGHT-EMITTING DIODE DEVICE AND MANUFACTURING METHOD THEREOF

BACKGROUND OF THE INVENTION (a) Field of the Invention

The present invention discloses an organic light-emitting diode device and a manufacturing method thereof. By means of the design of the light emitting layer structure, the device emits visible light with a lower color temperature at low voltages, and emits visible light with a higher color temperature at high voltages. By adjusting the input voltage, the device is capable to emit white light or other color lights with desired color temperature.

(b) Description of the Prior Art

An organic electro-luminescence display or an organic EL display is also referred to as an organic light emitting diode (OLED). C. W. Tang and S. A. Vanslyke et al. of Eastman Kodak Company used a vacuum evaporation method to make it in 1987 first. The hole transporting material and electron transporting material were deposited on transparent indium tin oxide glass, and then a metal electrode was vapor-deposited thereon to form the self-luminescent OLED device. Due to high brightness, fast response speed, light weight, compactness, true color, no difference in viewing angles, no need of LCD type backlight plates as well as a saving in light sources and low power consumption, it has become a new generation display.

Figure 1:
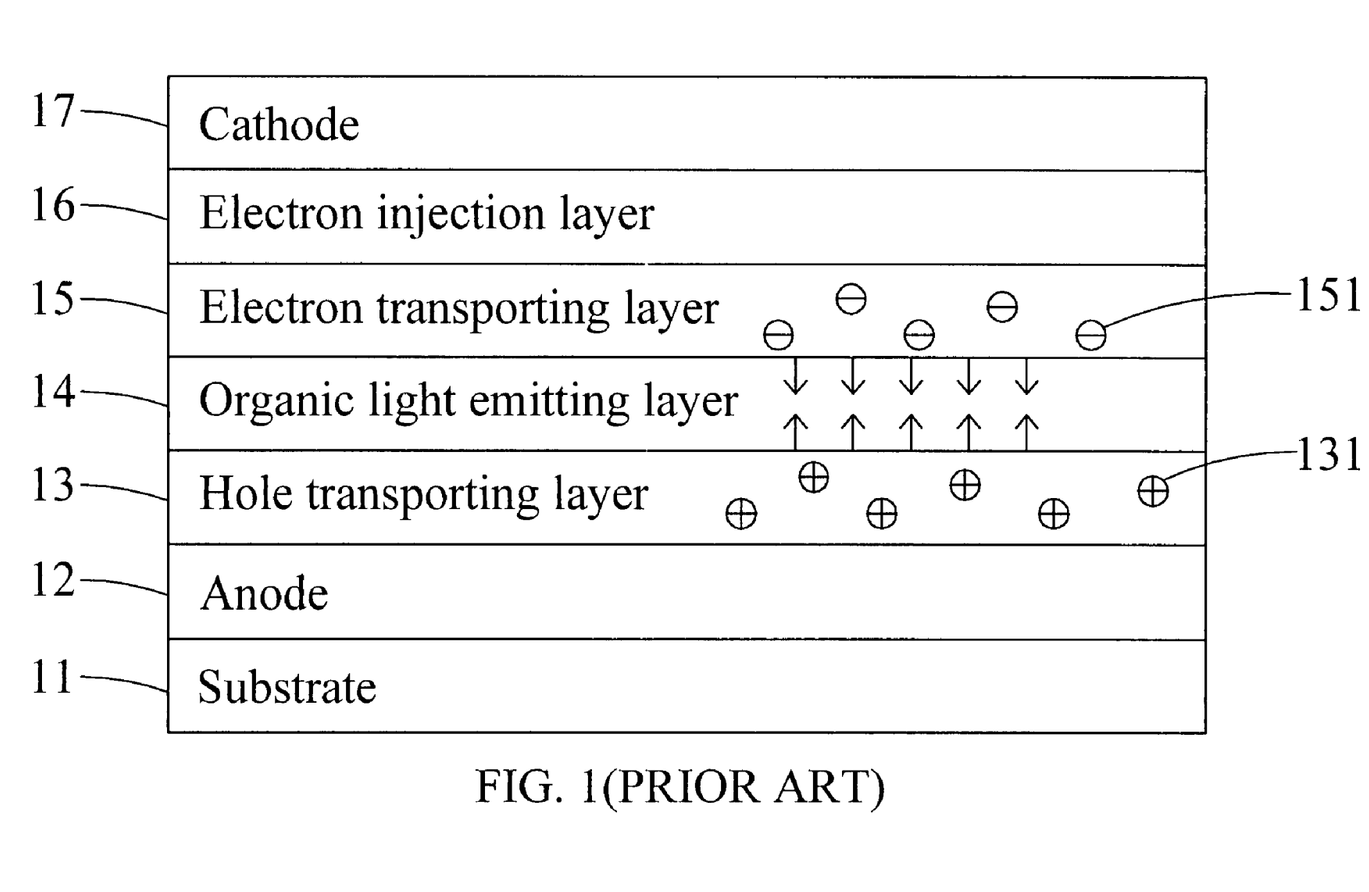
FIG. 1 is a cross-sectional view showing a structure of an OLED device according to the prior art.

Referring to FIG. 1, there is a cross-sectional view showing a structure of an OLED device according to the prior art. The OLED device structure sequentially comprises, from bottom to top, a transparent substrate 11, a transparent anode (ITO) 12, a hole transporting layer (HTL) 13, an organic light emitting layer (EL) 14, an electron transporting layer (ETL) 15, an electron injection layer (EIL) 16, and a metal cathode 17. When a forward bias is applied, holes 131 are injected from the anode 12 and electrons 151 are injected from the cathode 17. Due to the potential difference incurred from the external electrical field, the electrons 151 and the holes 131 will move in the thin film and recombine with each other in the organic light emitting layer 14. A part of the energy released by the recombination of the electron and hole pairs excites the luminescent molecules in the organic emitting layer 14 to excited-state molecules. When the excited-state molecules fall back to the ground state, a certain portion of the energy is released in a form of photons to emit light related to organic electroluminescence.

Figure 2:
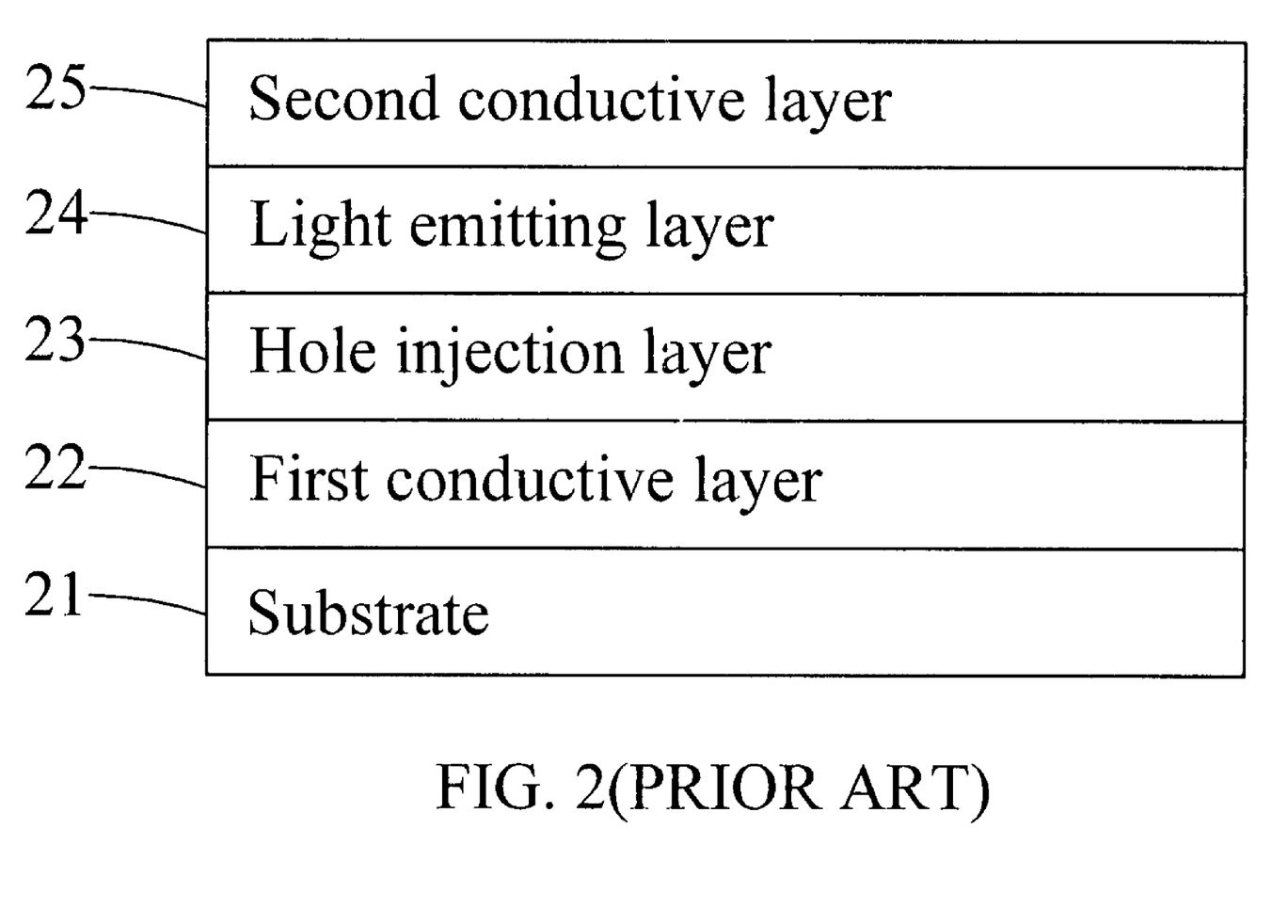
FIG. 2 is a cross-sectional view showing a structure of another OLED device according to the prior art.

Referring to FIG. 2, there is a cross-sectional view showing a structure of another OLED device according to the prior art. The OLED device was described by C. W. Tang in U.S. Pat. No. 4,356,429 (Eastman Kodak Company, 1982). In the invention, the OLED device structure sequentially comprises, from bottom to top, a transparent substrate 21, a transparent anode 22, a hole injection layer 23, a light emitting layer 24, and a metal cathode 25. When a forward bias is applied, holes are injected from the anode 22 and electrons are injected from the cathode 25. Due to the potential difference incurred from the external electrical field, the electrons and holes will move in the thin film and recombine with each other in the light emitting layer 24. A part of the energy released by the recombination of the electron and hole pairs excites the luminescent molecules in the light emitting layer 24 to excited-state molecules. When the excited-state molecules fall back to the ground state, a certain portion of the energy is released in a form of photons to emit light related to organic electroluminescence.

Figure 3:
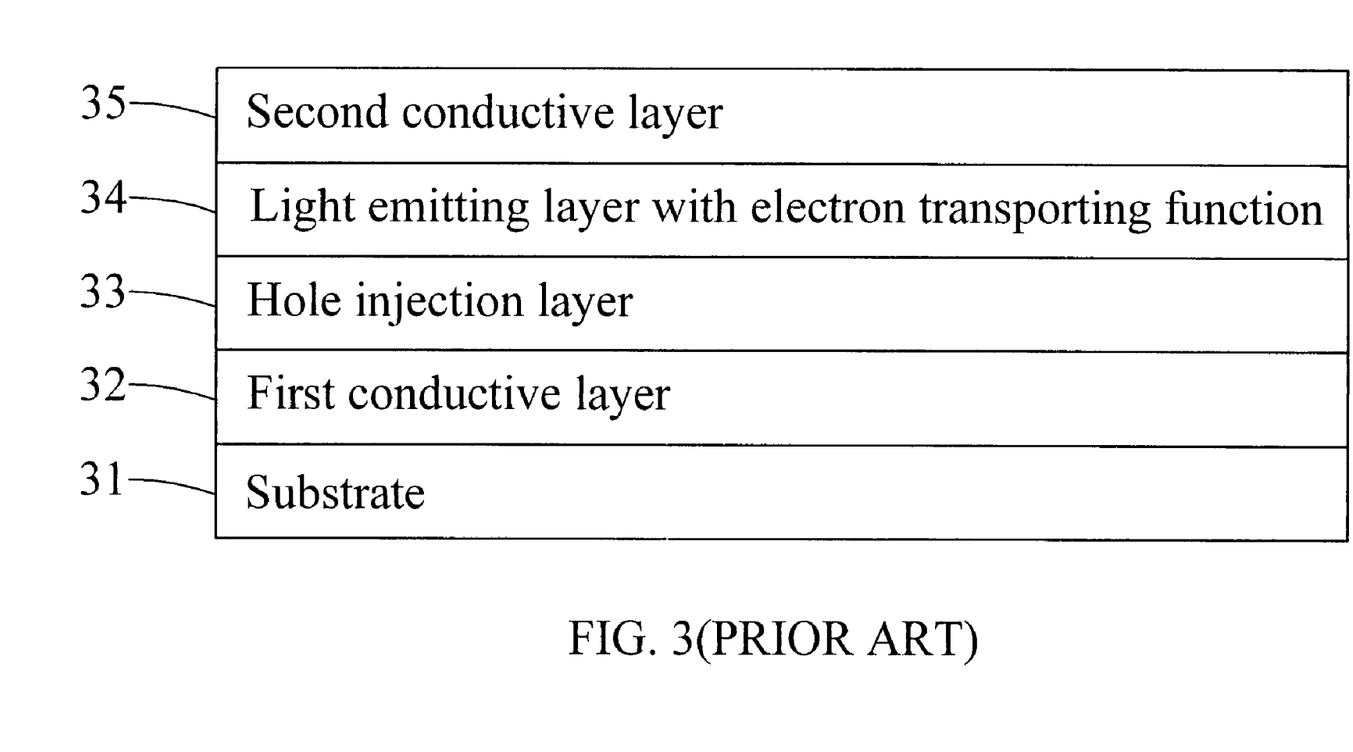
FIG. 3 is a cross-sectional view showing a structure of an OLED device of the prior art.

Referring to FIG. 3, there is also a cross-sectional view showing a structure of an OLED device of the prior art. The OLED device was proposed by C. W. Tang in U.S. Pat. No. 4,720,432 (Eastman Kodak Company, 1988). In the invention, the OLED device structure sequentially comprises, from. bottom to top, a transparent substrate 31, a transparent anode 32, a hole injection layer 33, a light emitting layer 34 having an electron transporting function, and a metal cathode 35. When a forward bias is applied, holes are injected from the anode 32 and electrons are injected from the cathode 35. Due to the potential difference incurred from the external electrical field, electrons and holes will move in the thin film and recombine with each other in the light emitting layer 34. A part of the energy released by the recombination of the electron and hole pairs excites the luminescent molecules in the light emitting layer 34 to excited-state molecules. When the excited-state molecules fall back to the ground state, a certain portion of the energy is released in a form of photons to emit light related to organic electroluminescence.

Figure 4:
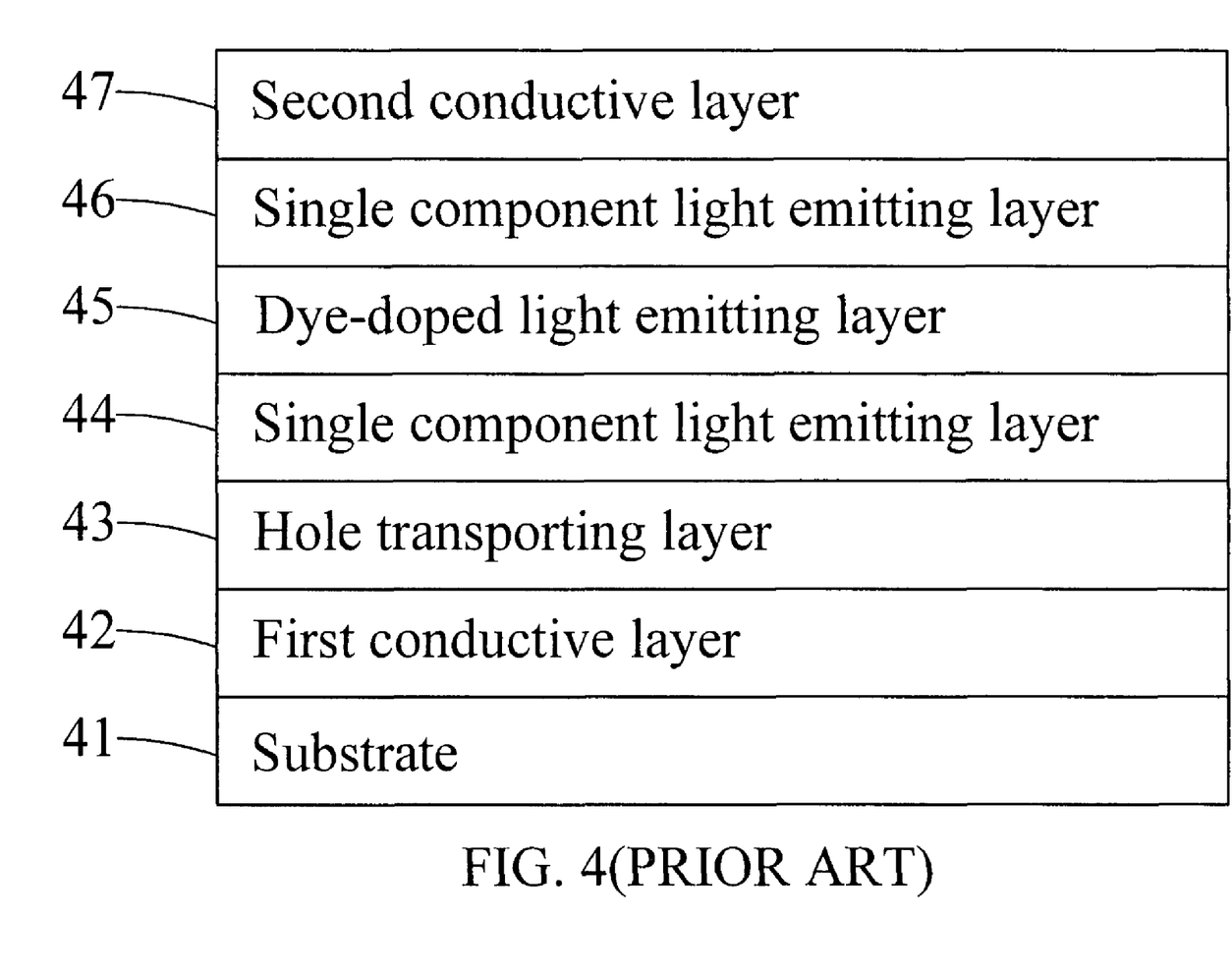
FIG. 4 is a cross-sectional view showing a structure of another OLED device of the prior art.

Referring to FIG. 4, therein illustrated is a doped type OLED device proposed by C. W. Tang et al. in Journal of Applied Physics, vol. 65, p. 3610 (1989). The OLED device structure sequentially comprises, from bottom to top, a transparent substrate 41, a transparent anode 42, a hole transporting layer 43, a single component light emitting layer 44, a dye-doped light emitting layer 45, a single component light emitting layer 46, and a metal cathode 47, which also can give organic electroluminescence.

Figure 5:
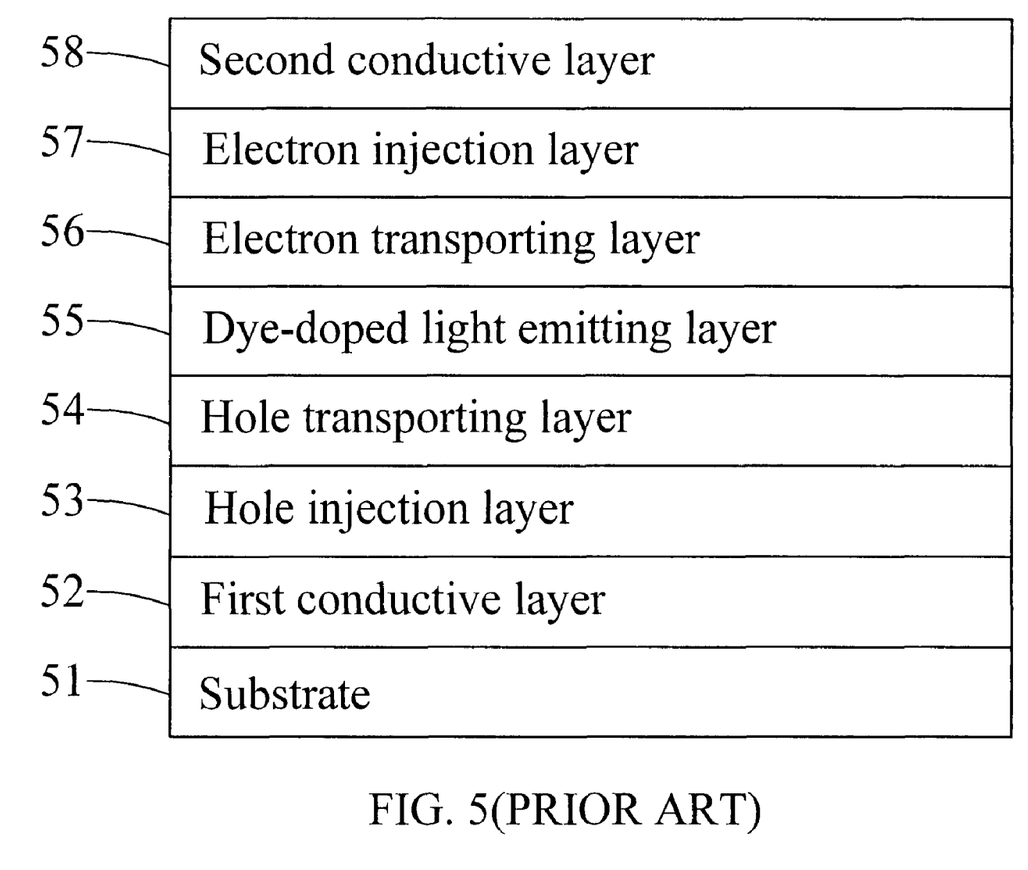
FIG. 5 is a cross-sectional view showing a structure of another OLED device of the prior art.

Referring to FIG. 5, therein illustrated is a doped type OLED device proposed by C. H. Chen et al. in Applied Physics Letters, vol. 85, p. 3301 (2004). The OLED device structure sequentially comprises, from bottom to top, a transparent substrate 51, a transparent anode 52, a hole injection layer 53, a hole transporting layer 54, a dye-doped light emitting layer 55, an electron transporting layer 56, an electron injection layer 57, and a metal cathode 58, which can give organic electroluminescence.

Figure 6:
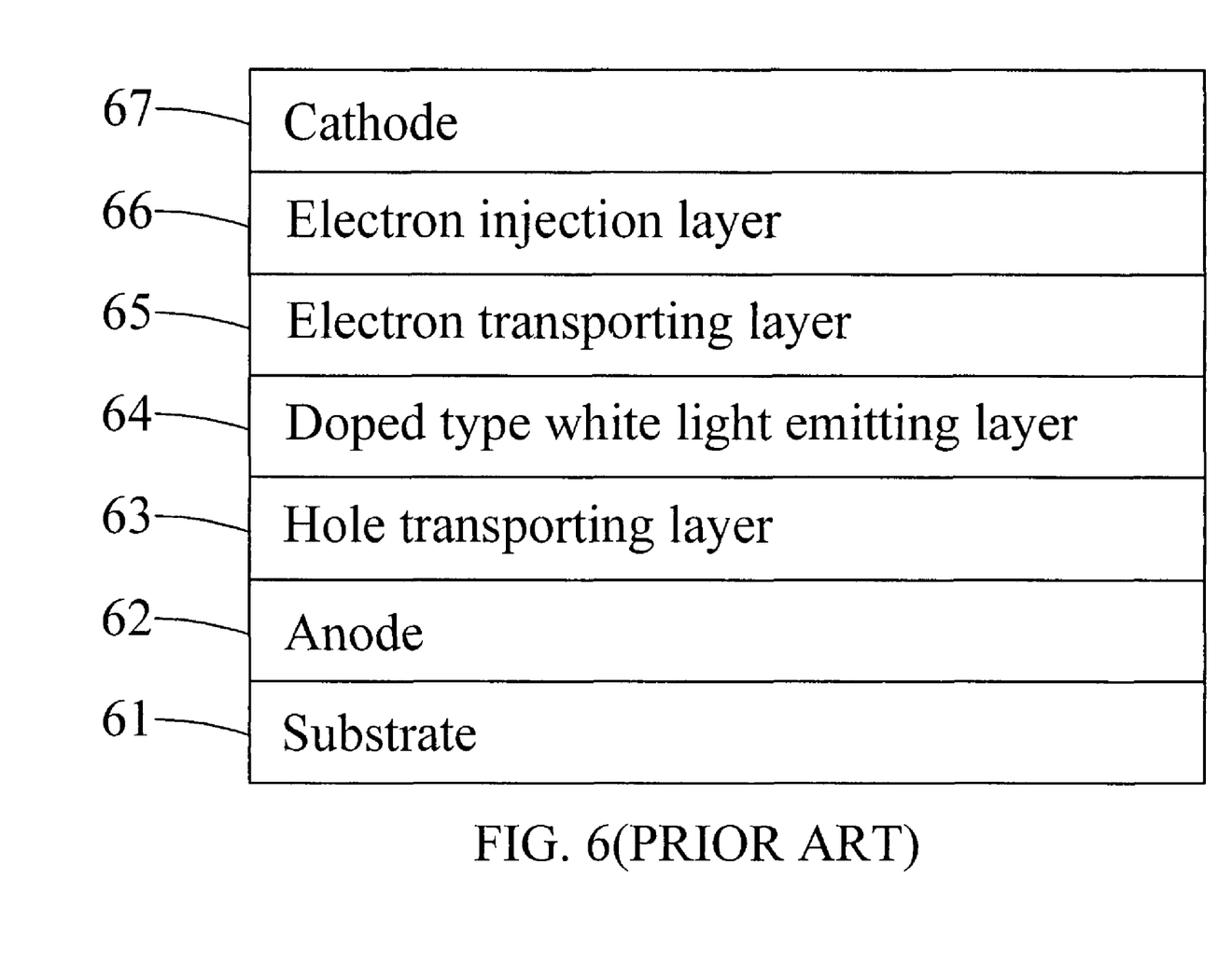
FIG. 6 is a cross-sectional view showing a structure of an OLED device of the prior art.

An OLED can emit light of different wavelengths based on the luminescent materials used. White light can be produced by mixing complementary lights. The luminescent materials can be arranged in different layers or can be deposited in the same light emitting layer. Referring to FIG. 6, therein illustrated is a white light OLED device with a single light emitting layer proposed by the present inventors in Applied Physics Letters, vol. 88, p. 193501 (2006). The OLED device structure sequentially comprises, from bottom to top, a transparent substrate 61, a transparent anode 62, a hole transporting layer 63, a doped type white light emitting layer 64, an electron transporting layer 65, an electron injection layer 66, and a metal cathode 67. The white light emitting layer 64 can be composed of a blue light emitting host doped with red light emitting dyes, or further, a blue light emitting host doped with green and red light emitting dyes, which emits white light related to organic electroluminescence.

Figure 7:
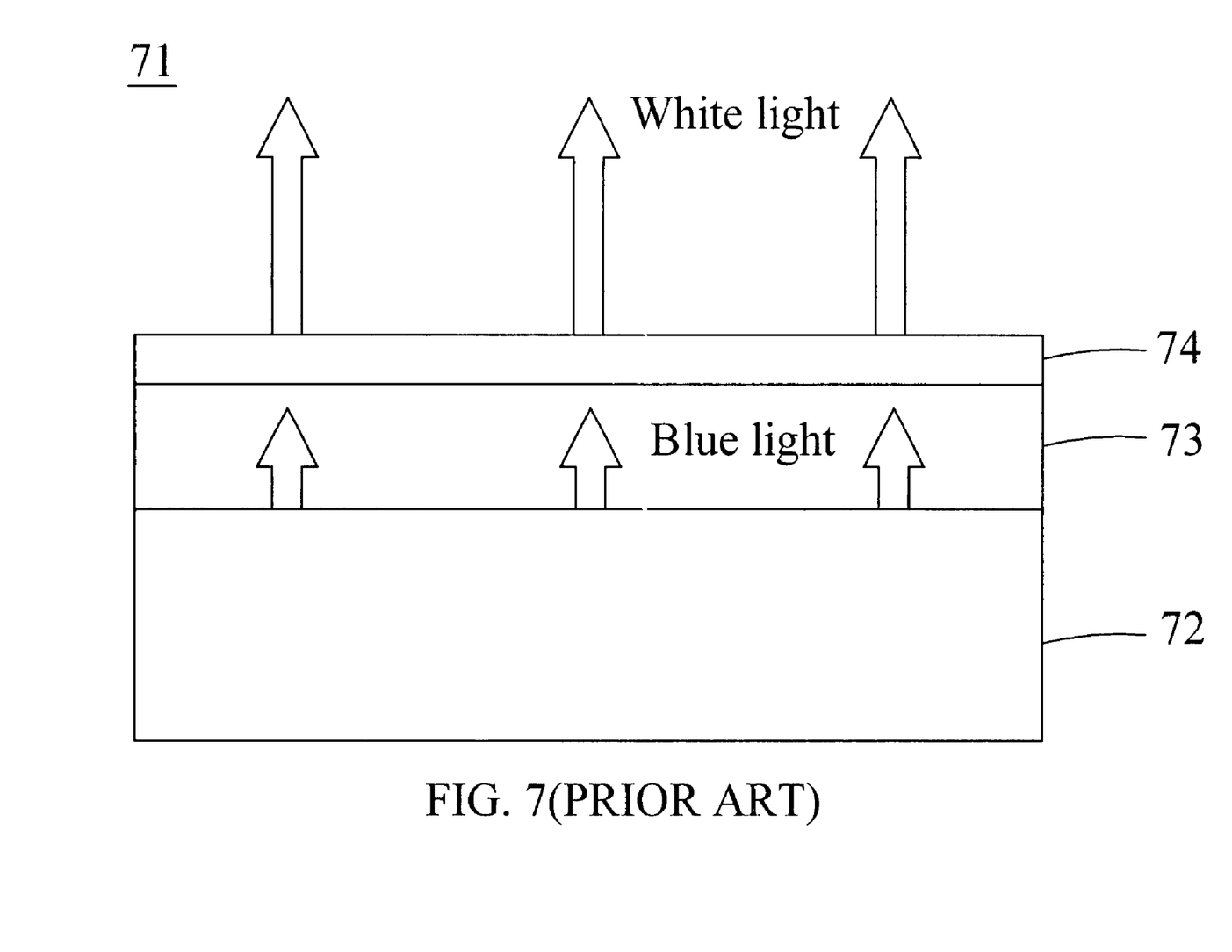
FIG. 7 is a cross-sectional view showing a structure of a light source device combining organic electroluminescence and photoluminescence of the prior art.

In addition to utilizing complementary lights generated by organic electroluminescence to produce white light, organic electroluminescence and photoluminescence can be used to produce white light. Referring to FIG. 7, therein illustrated is a light source device combining an organic layer and a photoluminescent layer proposed by A. R. Duggal et al. in U.S. Pat. No. 6,847,162 (General Electric (GE) Company). The light source 71 sequentially comprises, from bottom to top, an OLED device 72 which emits blue light, a transparent substrate 73, and a photoluminescent layer 74. The photoluminescent layer 74 absorbs the blue light emitted by the OLED device 72 and emits yellow light having lower energy. The light source mixes blue light and yellow light to produce white light.

Figure 8:
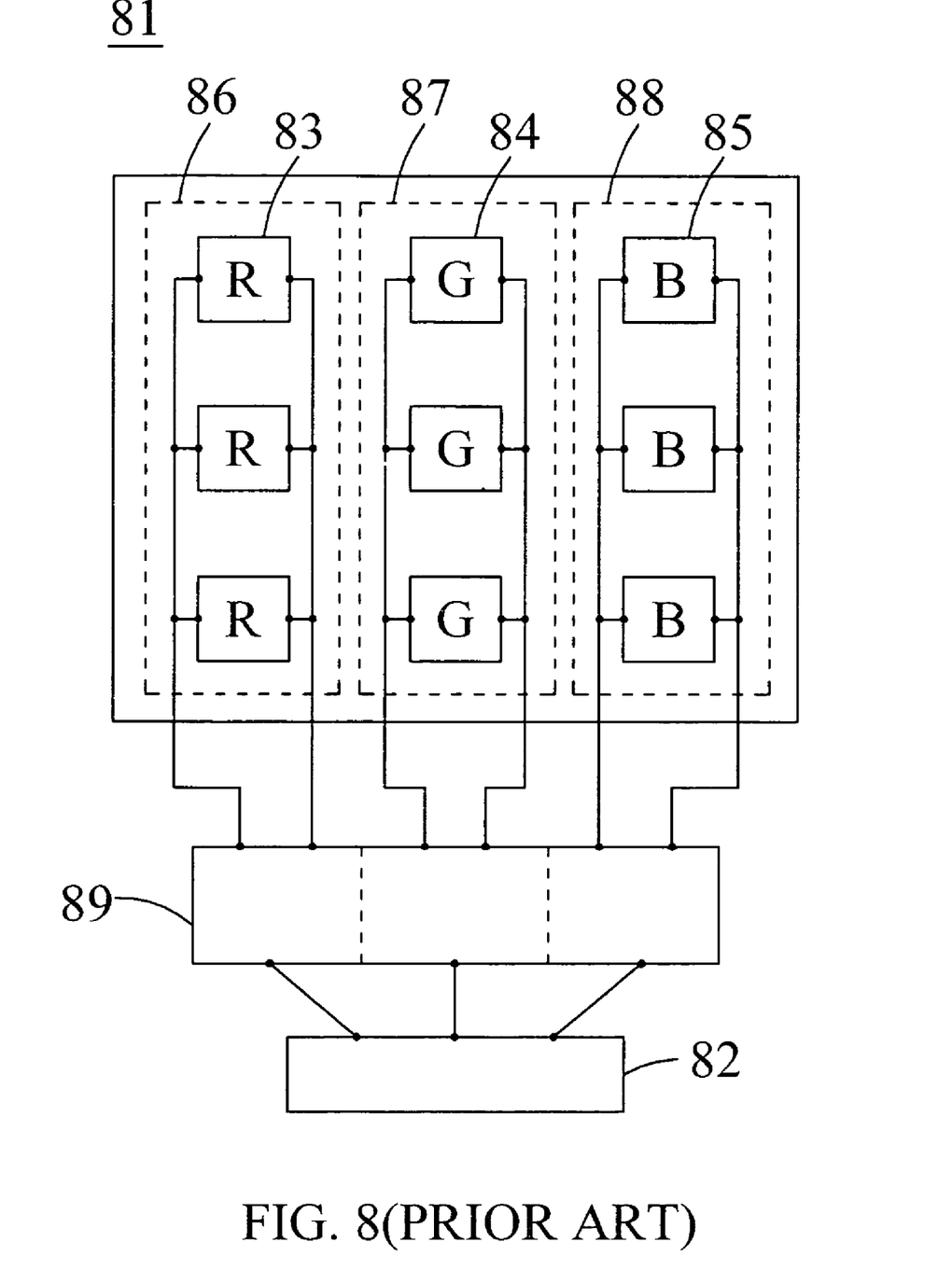
FIG. 8 is a schematic view showing a structure of a color tunable organic electroluminescent light source device of the prior art.

The color temperature of white light mixed from monochromatic lights of blue, green, red, and the like can be changed by tuning the intensity of each monochromatic light. Referring to FIG. 8, there is a schematic view showing a structure of a color tunable organic electroluminescent light source device proposed by A. R. Duggal et al. in U.S. Pat. No. 6,661,029 (General Electric (GE) Company). The light emitting device 81 comprises an integrated controller 82, an red light emitting OLED 83, an green light emitting OLED 84 and an blue light emitting OLED 85. The multiple monochromatic light OLEDs are connected with circuits to form light emitting device sets 86, 87 and 88 having larger light emitting area, respectively. The device further comprises a power source 89 that is electrically connected together to the integrated controller 82 and the OLEDs 83, 84 and 85. The intensity of each monochromatic light can be tuned by the integrated controller 82 to change the color temperature of the mixed white light.

As a result of a variety of extensive and intensive studies and discussions, the inventors herein propose an organic light-emitting diode device and a manufacturing method thereof based on their research for many years and plenty of practical experience. By means of the design of the light emitting layer structure of the device, the device is capable to emit white light or other color lights with desired color temperature without additional circuit control and only by adjusting the input voltage. The present invention has been accomplished based on these findings.

SUMMARY OF THE INVENTION

In view of the above problems, an objective of the present invention is to provide an organic light-emitting diode device and a manufacturing method thereof. The OLED device comprises more than one light emitting layer. The light emitting layer is capable to emit redder or longer wavelength visible light near a cathode, and emit bluer or shorter wavelength visible light near an anode. The device emits visible light with a lower color temperature at low voltages, and emits visible light with a higher color temperature at higher voltages. By adjusting the input voltage, the device is capable to emit white light or other color lights with desired color temperature.

Accordingly, to achieve the above objective, an organic light-emitting diode device of the present invention comprises a substrate, a first conductive layer, a hole transporting layer, a first light emitting layer, a second light emitting layer, an electron transporting layer, an electron injection layer, and a second conductive layer. The first light emitting layer is capable to emit bluer or shorter wavelength visible light, and the second light emitting layer is capable to emit redder or longer wavelength visible light.

Accordingly, to achieve the above objective, a manufacturing method of an organic light-emitting diode device of the present invention comprises:
a) providing a substrate;
b) forming a first conductive layer on the substrate;
c) forming a light emitting layer on the first conductive layer; and
d) forming a second conductive layer on the light emitting layer;
wherein the light emitting layer is capable to emit bluer or shorter wavelength visible light near the first conductive layer anode (anode), and emit redder or longer wavelength visible light near the second conductive layer (cathode).

In order that the technical features and effects of the present invention may be further understood and appreciated, the preferred embodiments are described below in detail with reference to the related drawings.

BRIEF DESCRIPTION OF THE DRAWINGS

The above objects, features and advantages of the invention will become more apparent from the following detailed description when taken in conjunction with the accompanying related drawings according to exemplary preferred embodiments of an organic light-emitting diode device and a manufacturing method thereof of the present invention.

DETAILED DESCRIPTION OF THE PREFERRED EMBODIMENTS

Figure 9:
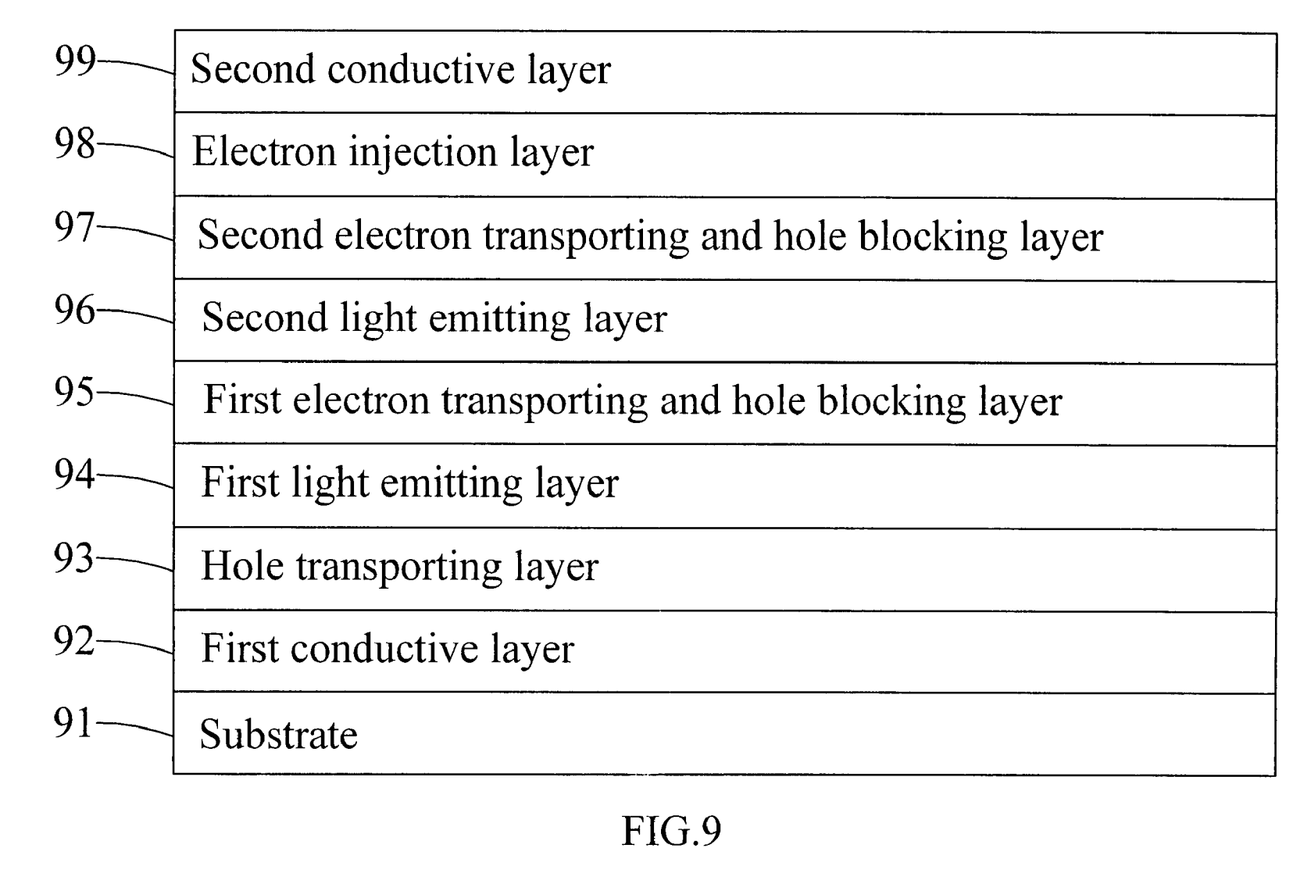
FIG. 9 is a cross-sectional view showing a structure of an OLED device according to a preferred embodiment of the present invention.

Referring to FIG. 9, there is a cross-sectional view showing a structure of an OLED device according to a preferred embodiment of the present invention. In this embodiment, the OLED device structure sequentially comprises, from bottom to top, a substrate 91, a first conductive layer 92, a hole transporting layer 93, a first light emitting layer 94, a first electron transporting and hole blocking layer 95, a second light emitting layer 96, a second electron transporting and hole blocking layer 97, an electron injection layer 98, and a second conductive layer 99. The first conductive layer 92 is deposited on the substrate 91. The hole transporting layer 93 is deposited on the first conductive layer 92. The first light emitting layer 94 is deposited on the hole transporting layer 93. The first electron transporting and hole blocking layer 95 is deposited on the first light emitting layer 94. The second light emitting layer 96 is deposited on the first electron transporting and hole blocking layer 95, and the second light emitting layer 96 is further provided thereon with a second electron transporting and hole blocking layer 97. The electron injection layer 98 is deposited on the second electron transporting and hole blocking layer 97, and the second conductive layer 99 is deposited on the electron injection layer 98.

As described above, the first emissive zone is capable to emit bluer or shorter wavelength visible light, and the second emissive zone is capable to emit redder or longer wavelength visible light.

Figure 10:
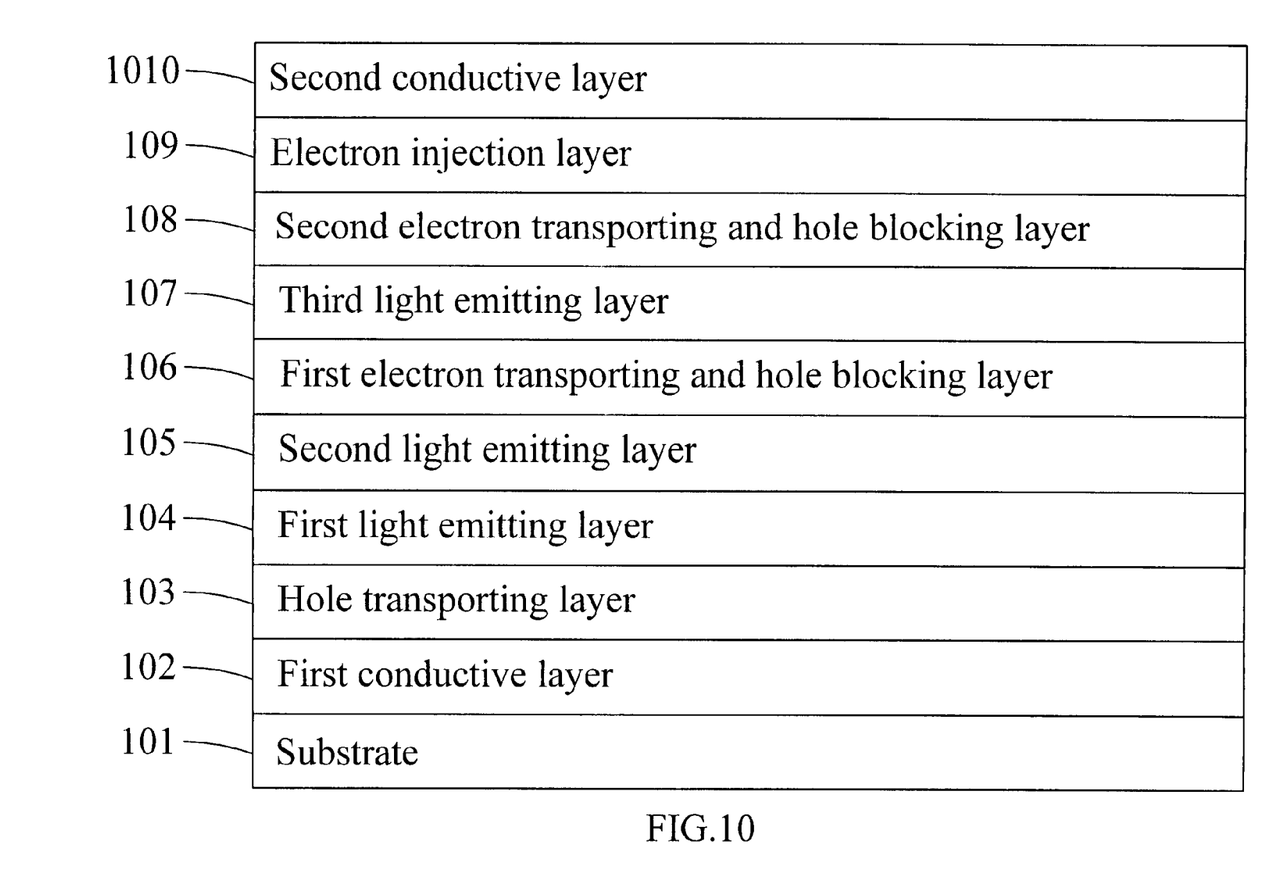
FIG. 10 is a cross-sectional view showing a structure of another OLED device according to another preferred embodiment of the present invention.

Referring to FIG. 10, there is a cross-sectional view showing a structure of an OLED device according to another preferred embodiment of the present invention. In this embodiment, the OLED device structure sequentially comprises, from bottom to top, a substrate 101, a first conductive layer 102, a hole transporting layer 103, a first light emitting layer 104, a second light emitting layer 105, a first electron transporting and hole blocking layer 106, a third light emitting layer 107, a second electron transporting and hole blocking layer 108, an electron injection layer 109, and a second conductive layer 1010. The first conductive layer 102 is deposited on the substrate 101. The hole transporting layer 103 is deposited on the first conductive layer 102. The first light emitting layer 104 is deposited on the hole transporting layer 103. The second light emitting layer 105 is deposited on the first light emitting layer 104. The first electron transporting and hole blocking layer 106 is deposited on the second light emitting layer 105. The third light emitting layer 107 is deposited on the first electron transporting and hole blocking layer 106, and the third light emitting layer 107 is further provided thereon with a second electron transporting and hole blocking layer 108. The electron injection layer 109 is deposited on the second electron transporting and hole blocking layer 108, and the second conductive layer 1010 is deposited on the electron injection layer 109.

As described above, the first emissive zone is capable to emit blue visible light, and the second emissive zone is capable to emit green visible light, and the third emissive zone is capable to emit red visible light.

Moreover, the light emitting layer further comprises more than one fluorescent or phosphorescent luminescent material as the materials of the light emitting layer, or there is/are provided a single organic material or multiple combinations of organic materials as a host material that is mixed with the fluorescent or phosphorescent luminescent material. The light emitting layer further incorporates one or multiple combinations of a carrier transporting material, a carrier injection material, a carrier blocking material or a functional auxiliary material such that the light emitting layer has functionalities. The light emitting layer emits light represented by x coordinate in a range from 0.25 to 0.55 and y coordinate in a range from 0.25 to 0.55 based on a CIE color system. The light emitting layer has a light source that exhibits a color-rendering index greater than 70. The hole transporting layers 93, 103 can generally be made of hole transporting materials, such as poly(3,4-ethylene-dioxythiophene)-poly-(styrenesulfonate) (PEDOT:PSS), N,N'-bis-(1-naphthy)-N,N'-biphenyl-1,1'-biphenyl-4,4'-diamine (NPB), or the like. The electron transporting and hole blocking layers 95, 97, 106 and 108 can generally be made of materials having an electron transporting and hole blocking function, such as 1,3,5-tris(N-phenyl-benzimidazol-2-yl)benzene(TPBi), tris(8-hydroxyquinoline) aluminum ($Alq_3$), or the like. The electron injection layers 98, 109 can generally be made of electron injection materials like lithium fluoride (LiF), etc. The second conductive layers 99, 1010 can generally be made of conductive materials like Al, etc. The substrates 91, 101 can generally be glass substrates, plastic substrates or metal substrates. The first conductive layers 92, 102 can generally be indium tin oxide (ITO) layers or indium zinc oxide (IZO) layers.

Figure 11:
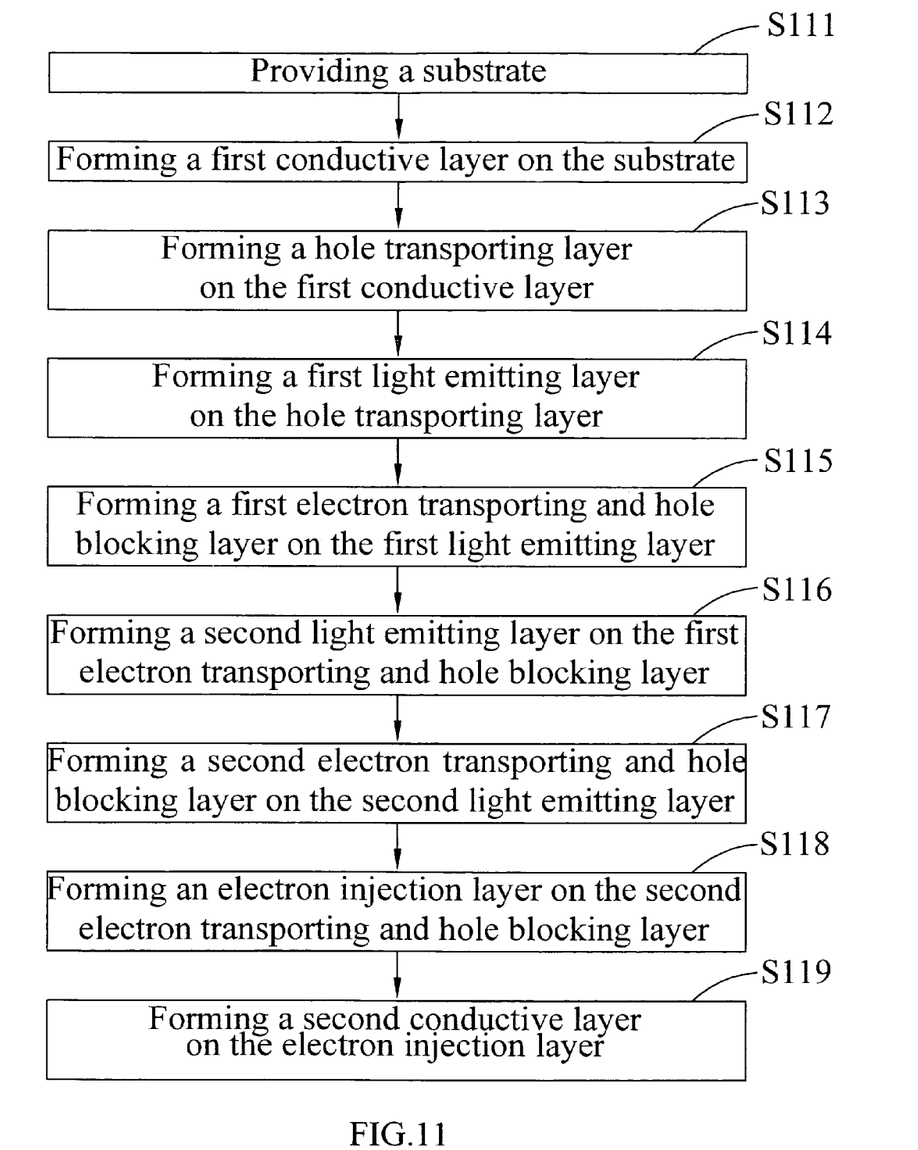
FIG. 11 is a flow chart of a manufacturing method of an OLED device according to a preferred embodiment of the present invention.

Referring to FIG. 11, there is a flow chart of a manufacturing method of an OLED device according to a preferred embodiment of the present invention. The method comprises the following steps:

Step S111: providing a substrate;

Step S112: forming a first conductive layer on the substrate;

Step S113: forming a hole transporting layer on the first conductive layer;

Step S114: forming a first light emitting layer on the hole transporting layer;

Step S115: forming a first electron transporting and hole blocking layer on the first light emitting layer;

Step S116: forming a second light emitting layer on the first electron transporting and hole blocking layer;

Step S117: forming a second electron transporting and hole blocking layer on the second light emitting layer;

Step S118: forming an electron injection layer on the second electron transporting and hole blocking layer; and Step S119: forming a second conductive layer on the electron injection layer.

The first emissive zone is capable to emit bluer or shorter wavelength visible light, and the second emissive zone is capable to emit redder or longer wavelength visible light. The light emitting layer further comprises more than one fluorescent or phosphorescent luminescent material as the materials of the light emitting layer, or there is/are provided a single organic material or multiple combinations of organic materials as a host material that is mixed with the fluorescent or phosphorescent luminescent material. The light emitting layer further incorporates one or multiple combinations of a carrier transporting material, a carrier injection material, a carrier blocking material or a functional auxiliary material such that the light emitting layer has functionalities. The light emitting layer emits light represented by x coordinate in a range from 0.25 to 0.55 and y coordinate in a range from 0.25 to 0.55 based on a CIE color system. The light emitting layer has a light source that exhibits a color-rendering index greater than 70. The hole transporting layer can generally be made of a hole transporting material, such as PEDOT:PSS, NPB, or the like. The electron transporting and hole blocking layers can generally be made of materials having an electron transporting and hole blocking function, such as TPBi, $Alq_3$, or the like. The electron injection layer can generally be made of an electron injection material like LiF, etc. The second conductive layer can generally be made of a conductive material like Al, etc. The substrate can be a glass substrate, plastic substrate or metal substrate. The first conductive layer can generally be made of ITO or IZO.

Figure 12:
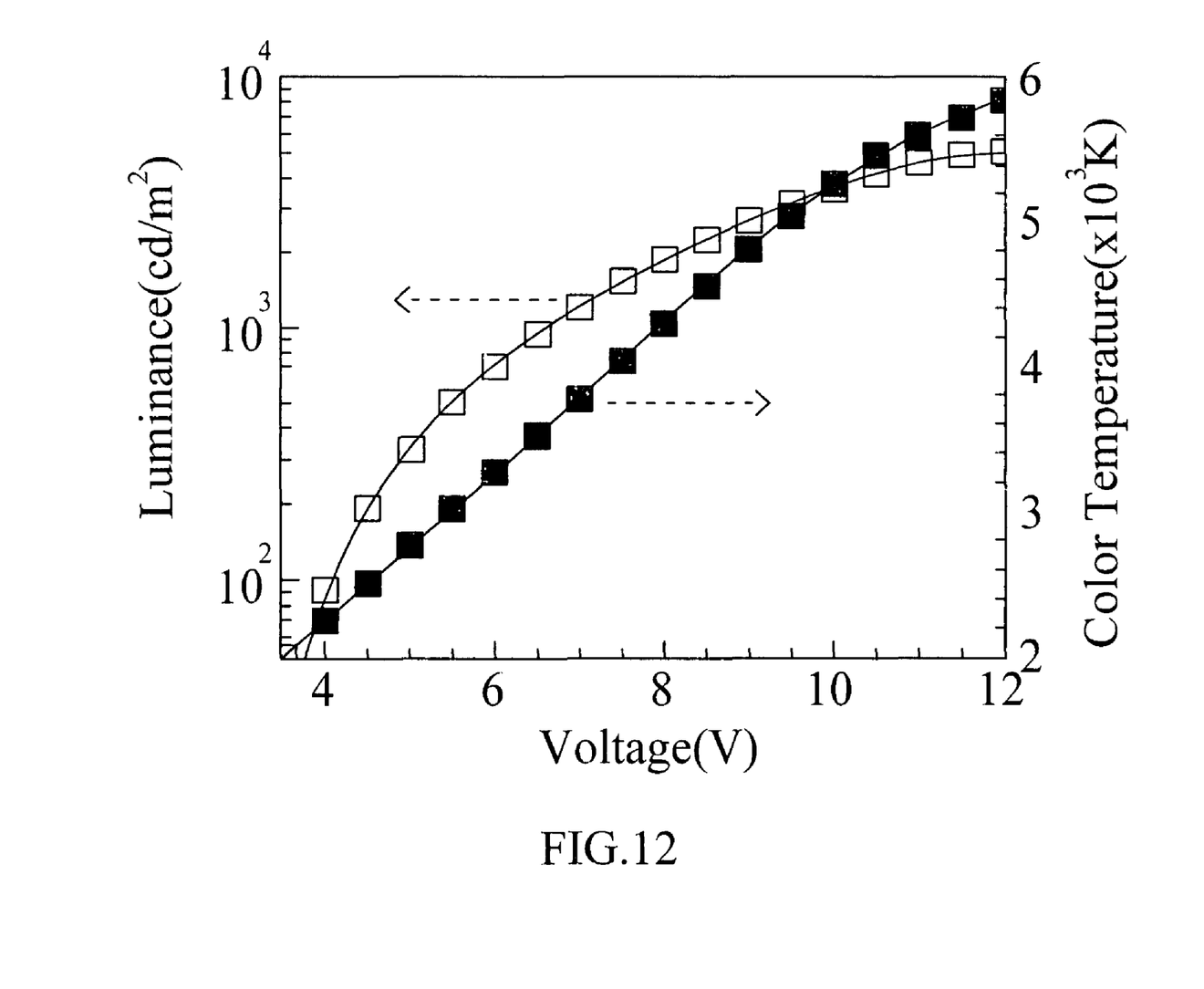
FIG. 12 is a diagram showing the luminance and color temperatures of an OLED device varying with voltages according to a preferred embodiment of the present invention.

Referring to FIG. 12, there is a diagram showing the luminance and color temperatures varying with voltages according to an preferred embodiment of the present invention.

Figure 13:
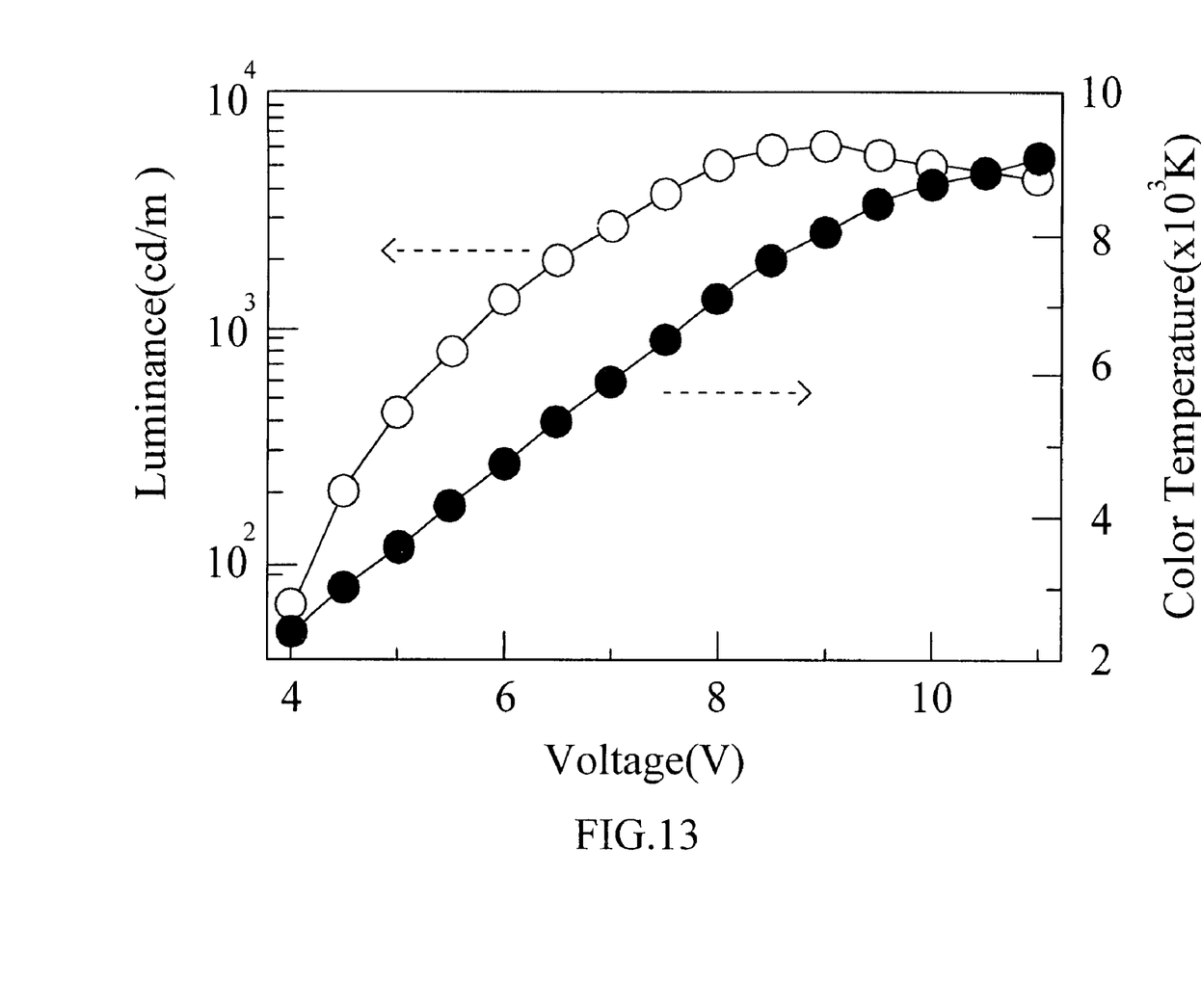
FIG. 13 is a diagram showing the luminance and color temperatures of an OLED device varying with voltages according to another preferred embodiment of the present invention.

Referring to FIG. 13, there is a diagram showing the luminance and color temperatures varying with voltages according to another preferred embodiment of the present invention.

EXAMPLE 1

Example 1 is an OLED device made according to the present invention. With reference to the device structure shown in FIG. 9, a glass substrate 91 coated with ITO as a transparent conductive anode 92 was subjected to ultrasonic vibration cleaning sequentially with a detergent, deionized water, acetone and isopropyl alcohol, and then placed in boiling hydrogen peroxide for surface treatment, followed by drying the surface with a nitrogen stream. Under the nitrogen atmosphere, PEDOT:PSS was spin coated to form a 35 nm thick hole transporting layer 93. Next, the substrate was moved into a vacuum chamber, and the vacuum chamber was exhausted to a pressure of $10^{-5}$ Torr. A 10 nm thick first light emitting layer 94, a 3 nm thick first electron transporting and hole blocking layer (TPBi) 95, a 5 nm thick second light emitting layer 96, a 35 nm thick second electron transporting and hole blocking layer (TPBi) 97, a 0.7 nm thick LiF electron injection layer 98, and a 150 nm thick aluminum electrode 99 were sequentially deposited by a heating vapor deposition method. The composition of the first light emitting layer 94 comprises a DPASN blue light emitting material that can emit blue visible light during electroluminescence. The composition of the second light emitting layer 96 comprises DPASN doped with 1 wt % of a red light emitting material DCJTB that can emit red visible light during electroluminescence. The OLED device emits light having a color temperature of 2200K at a voltage of 4V, and emits light having a color temperature of 5800K at a voltage of 12V. The variation of luminance and color temperatures with voltages is shown FIG. 12.

EXAMPLE 2

Example 2 is another OLED device made according to the present invention. With reference to the device structure shown in FIG. 10, a glass substrate 101 coated with ITO as a transparent conductive anode 102 was subjected to ultrasonic vibration cleaning sequentially with a detergent, deionized water, acetone and isopropyl alcohol, and then placed in boiling hydrogen peroxide for surface treatment, followed by drying the surface with a nitrogen stream. Under the nitrogen atmosphere, PEDOT:PSS was spin coated to form a 35 nm thick hole transporting layer 103. Next, the substrate was moved into a vacuum chamber, and the vacuum chamber was exhausted to a pressure of $10^{-5}$ Torr. A 10 nm thick first light emitting layer 104, a 2 nm thick second light emitting layer 105, a 3 nm thick first electron transporting and hole blocking layer (TPBi) 106, a 5 nm thick third light emitting layer 107, a 35 nm thick second electron transporting and hole blocking layer (TPBi) 108, is a 0.7 nm thick LiF electron injection layer 109, and a 150 nm thick aluminum electrode 1010 were sequentially deposited by a heating vapor deposition method. The composition of the first light emitting layer 104 comprises a DPASN blue light emitting material that can emit blue visible light during electroluminescence. The composition of the second light emitting layer 105 comprises DPASN doped with 0.1 wt % of C545T that can emit green visible light during electroluminescence. The composition of the third light emitting layer 107 comprises DPASN doped with 1 wt % of a red light emitting material DCJTB that can emit red visible light during electroluminescence. The OLED device emits light having a color temperature of 2200K at a voltage of 4V, and emits light having a color temperature of 9000K at a voltage of 11V. The variation of luminance and color temperatures with voltages is shown FIG. 13.

What is claimed is:

1. An organic light-emitting diode device comprising:
    a substrate;
    a first conductive layer deposited on the substrate;
    a light emitting layer deposited on the first conductive layer; and
    a second conductive layer deposited on the light emitting layer;
    wherein the light emitting layer is able to emit bluer or shorter wavelength visible light near the first conductive layer, and emit redder or longer wavelength visible light near the second conductive layer, and wherein the light emitting layer emits light with a voltage-variable color temperature which extents as high as approximately 10000K and as low as approximately 2000K.

2. The organic light-emitting diode device according to claim 1, wherein the light emitting layer is a single light emitting layer, double light emitting layer, or multiple light emitting layer structure.

3. The organic light-emitting diode device according to claim 1, wherein the light emitting layer further comprises more than one fluorescent luminescent material as the materials of the light emitting layer.

4. The organic light-emitting diode device according to claim 3, wherein the light emitting layer further comprises a single organic material or multiple combinations of organic materials as a host material that is mixed with the fluorescent luminescent material.

5. The organic light-emitting diode device according to claim 1, wherein the light emitting layer further comprises more than one phosphorescent luminescent material as the materials of the light emitting layer.

6. The organic light-emitting diode device according to claim 5, wherein the light emitting layer further comprises a single organic material or multiple combinations of organic materials as a host material that is mixed with the phosphorescent luminescent material.

7. The organic light-emitting diode device according to claim 1, wherein the light emitting layer further comprises more than one fluorescent luminescent material and more than one phosphorescent luminescent material as the materials of the light emitting layer.

8. The organic light-emitting diode device according to claim 7, wherein the light emitting layer further comprises a single organic material or multiple combinations of organic materials as a host material that is mixed with the fluorescent luminescent material and the phosphorescent luminescent material.

9. The organic light-emitting diode device according to claim 1, wherein the light emitting layer further incorporates one or multiple combinations of a carrier transporting material, a carrier injection material, a carrier blocking material or a functional auxiliary material such that the light emitting layer has functionalities.

10. The organic light-emitting diode device according to claim 1, wherein at least one functional auxiliary layer is formed between the first conductive layer and the light emitting layer.

11. The organic light-emitting diode device according to claim 1, wherein at least one functional auxiliary layer is formed between the light emitting layer and the second conductive layer.

12. The organic light-emitting diode device according to claim 10, wherein the functional auxiliary layer comprises one or multiple combinations of a carrier injection, a carrier transporting, a carrier blocking or a functional auxiliary material.

13. The organic light-emitting diode device according to claim 11, wherein the functional auxiliary layer comprises one or multiple combinations of a carrier injection, a carrier transporting, a carrier blocking or a functional auxiliary material.

14. The organic light-emitting diode device according to claim 2, wherein at least one functional auxiliary layer is further formed between the layers of the double light emitting layer structure or the multiple light emitting layer structure.

15. The organic light-emitting diode device according to claim 14, wherein the functional auxiliary layer comprises one or multiple combinations of a carrier injection, a carrier transporting, a carrier blocking or a functional auxiliary material.

16. The organic light-emitting diode device according to claim 1, wherein the light emitting layer emits light represented by x coordinate in a range from 0.25 to 0.55 and y coordinate in a range from 0.25 to 0.55 based on a CIE color system.

17. The organic light-emitting diode device according to claim 1, wherein the light emitting layer has a light source that exhibits a color-rendering index greater than 70.

18. A manufacturing method of an organic light-emitting diode device comprising:
   providing a substrate;
   forming a first conductive layer on the substrate;
   forming a light emitting layer on the first conductive layer; and
   forming a second conductive layer on the light emitting layer;
   wherein the light emitting layer is able to emit bluer or shorter wavelength visible light near the first conductive layer, and emit redder or longer wavelength visible light near the second conductive layer, and wherein the light emitting layer emits light with a voltage-variable color temperature which extents as high as approximately 10000K and as low as approximately 2000K.

19. The manufacturing method of an organic light-emitting diode device according to claim 18, wherein the light emitting layer is a single light emitting layer, double light emitting layer, or multiple light emitting layer structure.

20. The manufacturing method of an organic light-emitting diode device according to claim 18, wherein the light emitting layer further comprises more than one fluorescent luminescent material as the materials of the light emitting layer.

21. The manufacturing method of an organic light-emitting diode device according to claim 20, wherein the light emitting layer further comprises a single organic material or multiple combinations of organic materials as a host material that is mixed with the fluorescent luminescent material.

22. The manufacturing method of an organic light-emitting diode device according to claim 18, wherein the light emitting layer further comprises more than one phosphorescent luminescent material as the materials of the light emitting layer.

23. The manufacturing method of an organic light-emitting diode device according to claim 22, wherein the light emitting layer further comprises a single organic material or multiple combinations of organic materials as a host material that is mixed with the phosphorescent luminescent material.

24. The manufacturing method of an organic light-emitting diode device according to claim 18, wherein the light emitting layer further comprises more than one fluorescent luminescent material and more than one phosphorescent luminescent material as the materials of the light emitting layer.

25. The manufacturing method of an organic light-emitting diode device according to claim 24, wherein the light emitting layer further comprises a single organic material or multiple combinations of organic materials as a host material that is mixed with the fluorescent luminescent material and the phosphorescent luminescent material.

26. The manufacturing method of an organic light-emitting diode device according to claim 18, wherein the light emitting layer further incorporates one or multiple combinations of a carrier transporting material, a carrier injection material, a carrier blocking material or a functional auxiliary material such that the light emitting layer has functionalities.

27. The manufacturing method of an organic light-emitting diode device according to claim 18, wherein at least one functional auxiliary layer is formed between the first conductive layer and the light emitting layer.

28. The manufacturing method of an organic light-emitting diode device according to claim 18, wherein at least one functional auxiliary layer is formed between the light emitting layer and the second conductive layer.

29. The manufacturing method of an organic light-emitting diode device according to claim 27, wherein the functional auxiliary layer comprises one or multiple combinations of a carrier injection, a carrier transporting, a carrier blocking or a functional auxiliary material.

30. The manufacturing method of an organic light-emitting diode device according to claim 28, wherein the functional auxiliary layer comprises one or multiple combinations of a carrier injection, a carrier transporting, a carrier blocking or a functional auxiliary material.

31. The manufacturing method of an organic light-emitting diode device according to claim 19, wherein at least one functional auxiliary layer is further formed between the layers of the double light emitting layer structure or the multiple light emitting layer structure.

32. The manufacturing method of an organic light-emitting diode device according to claim 31, wherein the functional auxiliary layer comprises one or multiple combinations of a carrier injection, a carrier transporting, a carrier blocking or a functional auxiliary material.

33. The manufacturing method of an organic light-emitting diode device according to claim 18, wherein the light emitting layer emits light represented by x coordinate in a range from 0.25 to 0.55 and y coordinate in a range from 0.25 to 0.55 based on a CIE color system.

34. The manufacturing method of an organic light-emitting diode device according to claim 18, wherein the light emitting layer has a light source that exhibits a color-rendering index greater than 70.

* * * * *